United States Patent [19]
Shirasu et al.

[11] Patent Number: 5,657,130
[45] Date of Patent: Aug. 12, 1997

[54] EXPOSURE APPARATUS AND METHOD

[75] Inventors: Hiroshi Shirasu, Yokohama; Kazuaki Saiki, Tokyo; Seiji Miyazaki, Yokohama; Susumu Mori, Tokyo, all of Japan

[73] Assignee: Nikon Corporation, Tokyo, Japan

[21] Appl. No.: 408,714

[22] Filed: Mar. 22, 1995

[30] Foreign Application Priority Data

Mar. 28, 1994 [JP] Japan .................. 6-057088

[51] Int. Cl.⁶ .................................. G01B 11/00
[52] U.S. Cl. ................ 356/401; 250/548; 250/559.3
[58] Field of Search ........................ 356/399–401; 355/43, 53; 250/559.3, 548

[56] References Cited

U.S. PATENT DOCUMENTS

| | | | |
|---|---|---|---|
| 5,448,332 | 9/1995 | Sakakibara et al. | 355/53 |
| 5,461,237 | 10/1995 | Wakamoto et al. | 356/401 |

*Primary Examiner*—K. Hantis
*Attorney, Agent, or Firm*—Shapiro and Shapiro

[57] ABSTRACT

In an exposure apparatus and method, a mask and a substrate are scanned in synchronism with each other so that the pattern of the mask may be transferred onto the substrate through a projection optical system. First beams of light are irradiated to least two locations on the mask spaced apart in a direction intersecting the scanning direction of the mask. The reflected light thereof is received, and the positions of the points on the mask to which the beam of light has been irradiated are detected in the direction of the optical axis of the projection optical system. In addition, second beams of light are irradiated to at least two locations on the substrate spaced apart in the scanning direction, and the reflected light thereof is received. The positions of the points on the substrate to which the second beam of light has been irradiated are also detected in the direction of the optical axis of the projection optical system are detected. The posture of at least one of the mask and the substrate is adjusted on the basis of the positions detected with the first and second beams.

35 Claims, 4 Drawing Sheets

EXPOSURE APPARATUS AND METHOD

BACKGROUND OF THE INVENTION

1. Field of the Invention

This invention relates to an exposure apparatus and method suitable for use in exposing a pattern of a large area onto a photosensitive substrate as in a case where, for example, a liquid crystal panel or the like is manufactured by the photolithography process.

2. Related Background Art

Recently, considerable attention has been devoted to a scanning type exposure apparatus in which, in order to manufacture, for example, a large liquid crystal panel (liquid crystal display element), a semiconductive element of a large area or the like, a slit-like (rectangular, arcuate or otherwise shaped) illuminated area is formed on a mask (such as a photomask or a reticle), the mask is scanned in the direction of the shorter side of the illuminated area, and a plate having photoresist applied thereto (such as a glass plate or a semiconductor wafer) is scanned in synchronism in an exposure area conjugate with the illuminated area, whereby patterns on the mask are successively transferred onto the plate.

In such a scanning type exposure apparatus, as well as in an exposure apparatus wherein exposure is effected onto each shot area on a plate in a stationary state, auto focusing and auto levelling mechanisms are necessary for accurately adjusting the exposed surface of the plate to the imaging plane (best focus plane) of a projection optical system so that the patterns on the mask may be transferred onto the plate with high resolution. In the case of the scanning exposure type, the mask and plate are scanned during exposure and therefore, the auto focusing and auto levelling mechanisms tend to become complicated as compared with a case where exposure is effected in a stationary state.

FIG. 7 of the accompanying drawings shows an example of the scanning type exposure apparatus according to the prior art. Exposure light from a light source 1 such as a mercury lamp is condensed by an elliptical mirror 2 and enters an illuminating optical system 3. The exposure light IL emerging from the illuminating optical system 3 forms a slit-like illuminated area 5 of uniform illuminance distribution on the pattern forming surface of a mask 4. The mask 4 is held on the upper stage 6a of a scanning stage 6, and a plate 8 is held on a lower stage 6b with a Z levelling stage 7 interposed therebetween. The scanning stage 6 is driven on a base 11 in ±X directions, and between the upper stage 6a and the lower stage 6b, a projection optical system 9 for projecting the erect positive image of a mask pattern at one-to-one magnification is fixedly disposed relative to the base 11. The image of the pattern in the illuminated area 5 is projected onto a slit-like exposure field 10 on the plate 8.

In this case, the image of the mask pattern in the exposure field 10 is an erect positive image and therefore, by the scanning stage 6 being driven in X direction to thereby scan the mask 4 and the plate 8 as a unit in X direction, the patterns on the mask 4 are successively transferred onto the plate 8.

Also, a focus detecting system of the oblique incidence type comprising a light transmitting optical system 12a and a light receiving optical system 12b is provided to detect the position of the surface (exposed surface) of the plate 8 in the exposure field 10 in a direction (Z direction) parallel to the optical axis of the projection optical system 9. In this focus detecting system, for example, a slit pattern image is obliquely projected from the light transmitting optical system 12a onto the plate 8 in the central portion of the exposure field 10, and the reflected light from the plate 8 enters the light receiving optical system 12b and the slit pattern image in the light receiving optical system 12b is re-imaged. When the plate 8 is displaced in Z direction, the re-imaged slit pattern image deviates laterally.

The position of the re-imaged image when the exposed surface of the plate 8 is coincident with the imaging plane of the projection optical system 9 is memorized in advance as a reference position, and a focus signal corresponding to the amount of deviation of the re-imaged image from the reference position is produced by the light receiving optical system 12b. The amount of deviation of the projection point (measurement point) of the slit pattern image in Z direction relative to the imaging plane is detected from the focus signal. The Z levelling stage 7 is driven to continuously adjust the position of the plate 8 in Z direction so that the amount of deviation in Z direction may be negated when the mask 4 and plate 8 are scanned, whereby scanning exposure has been effected with auto focusing.

Further in some cases, two measurement points have been provided on the plate 8. When there are two measurement points like this, a focus detecting system of the same construction as the focus detecting system comprising the light transmitting optical system 12a and the light receiving optical system 12b has been further provided in the direction perpendicular to the plane of the drawing sheet of FIG. 7 and the amounts of positional deviation in Z direction at the two measurement points have been detected. At this time, the difference between the amounts of positional deviation at the two measurement points indicates the inclination of the exposed surface of the plate 8 in a plane perpendicular to the scanning direction and therefore, the Z levelling stage 7 has been driven to effect the correction of the inclination by the auto levelling system.

As described above, in the scanning type exposure apparatus according to the prior art, the amount of positional deviation of the plate 8 in Z direction has been detected at one or two points in the central portion of the exposure field 10 of the projection optical system 9 and in a direction perpendicular to the scanning direction, and focusing or levelling has been effected on the basis of this amount of positional deviation.

In the prior art, however, when the flatness of the mask 4 is bad or when the position of the mask 4 fluctuates in Z direction depending on the accuracy of the running of the scanning stage 6, the position of the imaging plane of the projection optical system 9 changes, and this has led to the inconvenience that simply by correcting the position of the plate 8, it is impossible to adjust the exposed surface of the plate 8 to the imaging plane.

Even if the flatness of the mask 4 is good and the accuracy of the running of the scanning stage 6 is good, when the exposed surface of the plate 8 is a curved surface, the shape of the exposed surface could not be accurately found if the amount of positional deviation in Z direction is detected at two or less measurement points in the direction perpendicular to the scanning direction, and this has resulted in the inconvenience that it is impossible to adjust the average plane of the exposed surface of the plate 8 in the exposure field 10 to the imaging plane.

SUMMARY OF THE INVENTION

In view of such points, the present invention has as an object thereof the provision of an exposure apparatus and method in which even when the flatness or the like of not only a plate but also a mask is bad, or when the feed accuracy of a mask is bad, exposure can be effected with the exposed surface of the plate adjusted to the imaging plane of a projection optical system.

The present invention has as a further object thereof the provision of an exposure apparatus and method in which even when the exposed surface of a plate or the pattern forming surface of a mask is distorted into a curved shape, exposure can be effected with the exposed surface of the plate adjusted to the imaging plane of a projection optical system.

To achieve the above objects, the exposure apparatus of the present invention may comprise:

a scanning system for scanning a mask and a substrate in synchronism with each other so that the pattern of said mask may be transferred onto said substrate at one-to-one magnification through a projection optical system;

a first detecting system for irradiating first beams of light to at least two points on said mask spaced apart in a direction orthogonal to the scanning direction of said mask, reflected light from those points, and detecting the positions of those points in the direction of the optical axis of said projection optical system;

a second detecting system for irradiating second beams of light to at least two points on said substrate spaced apart in a direction orthogonal to the scanning direction of said substrate receiving reflected light from those points, and detecting the positions of those points in the direction of the optical axis of said projection optical system; and an adjusting system for adjusting the posture of at least one of said mask and said substrate based on the positions detected by said first detecting system and said second detecting system.

According to the above-described construction, even when the flatness of not only the substrate (plate) but also the mask is bad, or when the feed accuracy of the mask is bad, exposure can be effected with the exposed surface of the plate adjusted to the imaging plane of the projection optical system.

DESCRIPTION OF THE PREFERRED EMBODIMENT

An embodiment of a scanning type exposure apparatus according to the present invention will hereinafter be described with reference to the drawings. The present embodiment is one in which the present invention is applied to a scanning type exposure apparatus having a plurality of projection optical systems for projecting erect positive images at one-to-one magnification.

Figure 1:
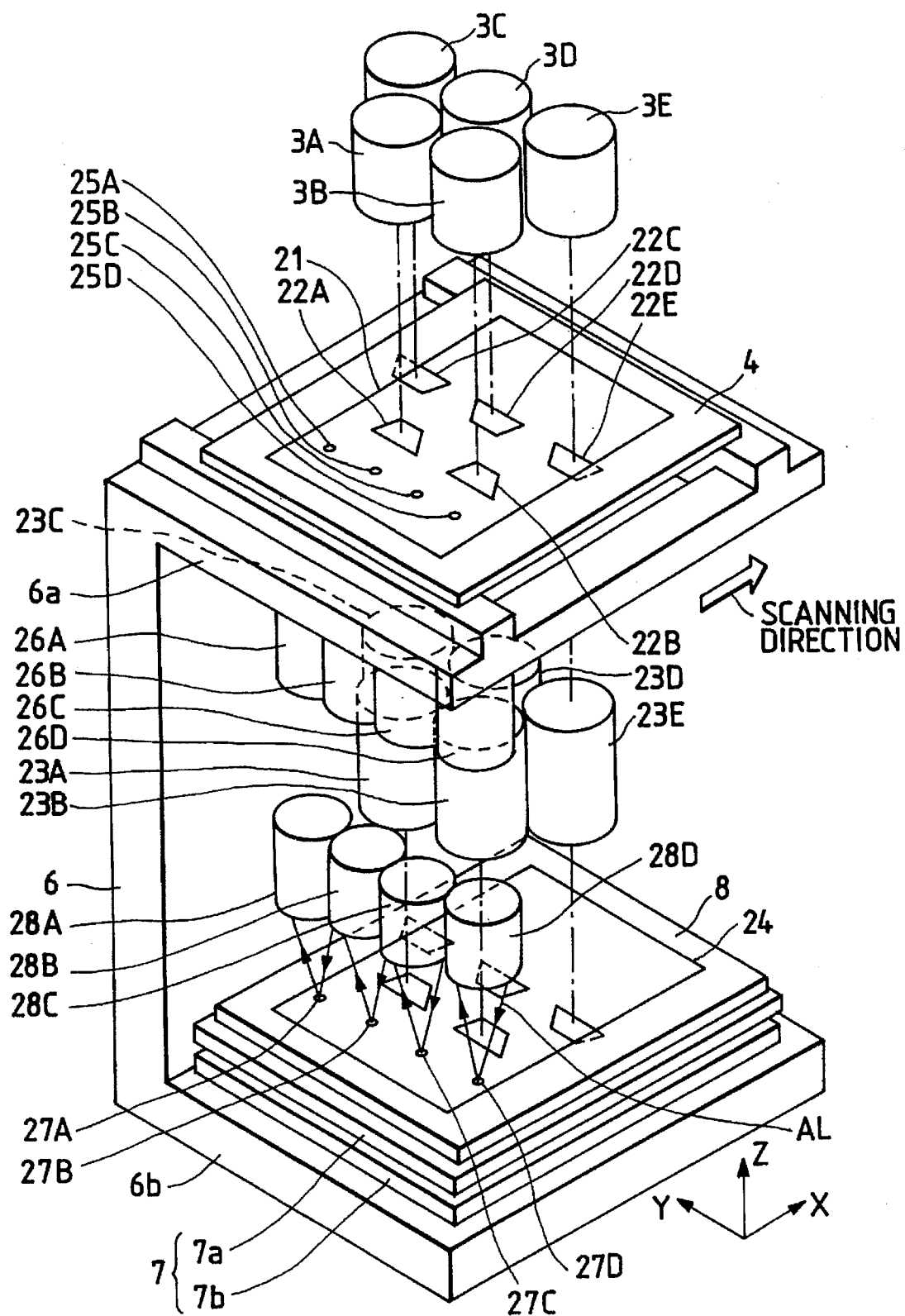
FIG. 1 is a perspective view schematically showing the construction of the exposure system of a scanning type exposure apparatus according to the present invention.
Figure 3:
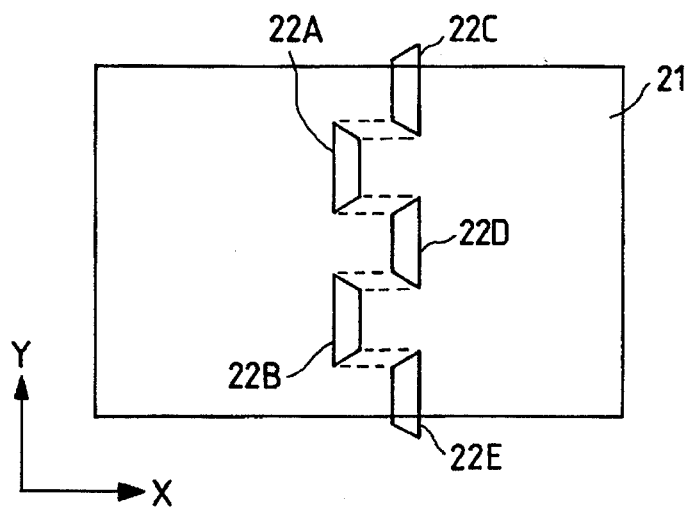
FIG. 3 is a plan view showing the positional relations between the pattern forming area 21 and illuminated areas 22A to 22E of a mask 4.

Referring to FIG. 1 which is a perspective view schematically showing the construction of the exposure system of the scanning type exposure apparatus according to the present embodiment, a mask 4 is held on the upper stage 6a of a scanning stage 6. Five trapezoidal illuminated areas 22A to 22E formed on a pattern forming area 21 on the mask 4 are illuminated by exposure light from illuminating optical systems 3A to 3E corresponding thereto. The illuminated areas 22A to 22E are divided into two rows set at a predetermined interval in X direction which is the scanning direction, and two illuminated areas 22A and 22B are arranged in a first row and three illuminated areas 22C to 22E are arranged in a second row. The trapezoidal illuminated areas 22A to 22E, as shown in FIG. 3, are arranged so that when the scanning stage 6 is scanned in X direction, the positions of corresponding lines of adjacent illuminated areas (e.g. 22A and 22C; 22A and 22D) in Y direction may coincide with each other.

A plate 8 as a substrate to be exposed having photoresist applied thereto is held on the lower stage 6b of the scanning stage 6 with a Z levelling stage 7 interposed therebetween, and between the mask 4 and the plate 8, five projection optical systems 23A to 23E for projecting the pattern image of the mask 4 onto the plate 8 are arranged so as to coincide with the optical axes of the illuminating optical systems 3A to 3E, respectively. The Z-axis is parallel to the optical axes of the projection optical systems 23A to 23E, and the Y-axis is perpendicular to the X-axis (scanning direction) in a plane perpendicular to the Z-axis.

Figure 4:
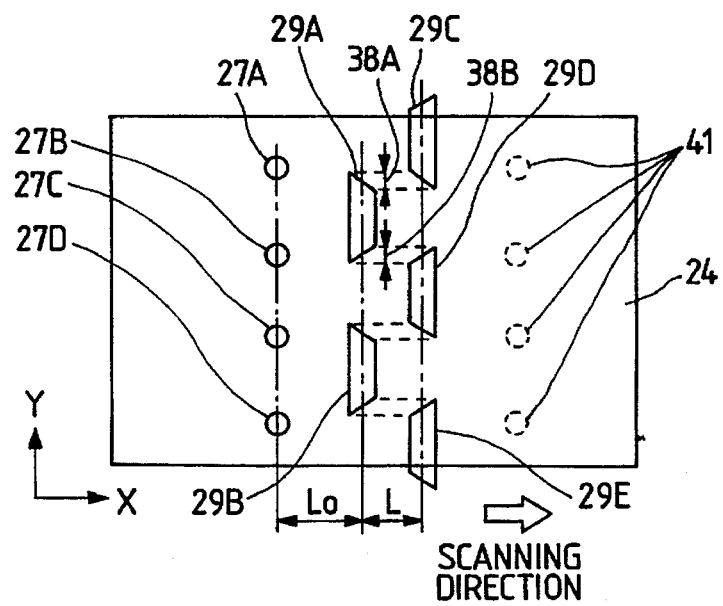
FIG. 4 is a plan view showing the relations among the pattern transfer area 24, the exposure fields 29A to 29E and the measurement points 27A to 27D of a plate 8.

By the projection optical systems 23A to 23E, trapezoidal exposure fields 29A to 29E are formed on pattern transfer area 24 on the plate 8 (see FIG. 4).

The images of patterns in the illuminated areas 22A to 22E on the mask 4 are formed in the exposure fields 29A to 29E, respectively, on the plate 8 through the projection optical systems 23A to 23E. As shown in FIG. 4, the adjacent exposure fields (e.g. 29A and 29C or 29A and 29D) in Y direction are formed so that the positions of corresponding oblique lines of the trapezoids in Y direction may coincide with each other. Accordingly, when the scanning stage 6 (plate 8) is scanned, for example, an area 38A passes through corresponding oblique lines of the exposure fields 29A and 29C and an area 38B passes through corresponding oblique lines of the exposure fields 29A and 29D. Thereby, exposure energy is made uniform on the whole surface of the plate 8.

Turning back to FIG. 1, as the projection optical systems 23A to 23E, use can be made, for example, of mirror projection type projection optical systems each comprising a combination of a concave mirror and a convex mirror or the like. By the scanning stage 6 being driven to scan the mask 4 and the plate 8 as a unit in X direction, the patterns in the pattern area 21 on the mask 4 are successively exposed onto a shot area 24 on the plate 8.

Figure 2:
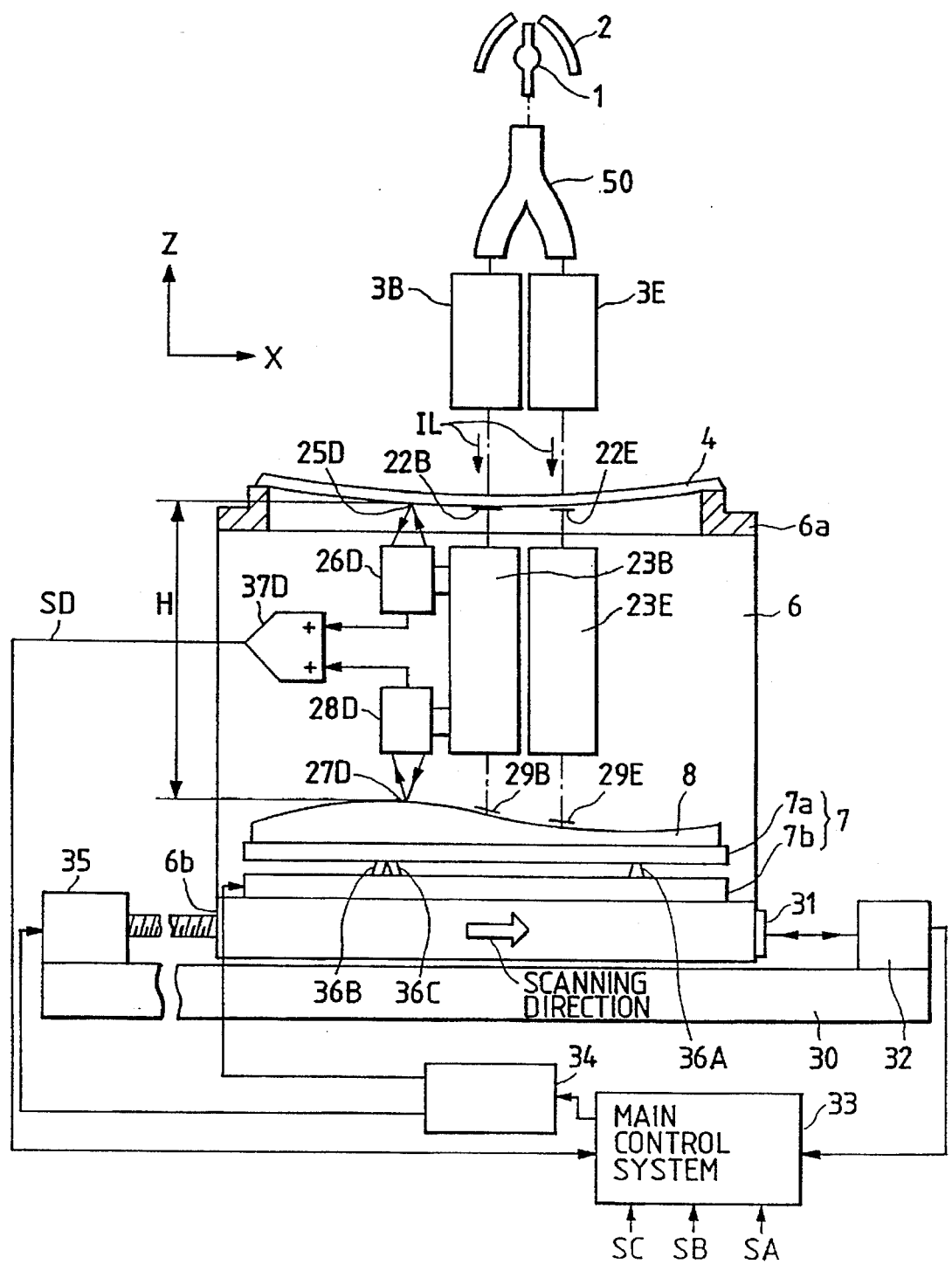
FIG. 2 is a side view schematically showing the construction of the exposure system.

FIG. 2 is a side view schematically showing the construction of the exposure system of the scanning type exposure apparatus according to the present embodiment. In FIG. 2, exposure light from a mercury lamp 1 is condensed by an elliptical mirror 2 and is directed to the entrance end of a light guide 50. The exposure light emerging from five exit ends of the light guide 50 illuminates the mask 4 through five illuminating optical systems 3A to 3E (in FIG. 2, two illuminating optical systems 3B and 3E only being shown). Also, the scanning stage 6 is placed on a base 30 so as to be capable of being driven in X direction through a drive motor 35. A movable mirror 31 is fixed to the end portion of the scanning stage 6 in X direction. The position of the scanning stage 6 in X direction is normally measured using the movable mirror 31 and a laser interferometer 32 fixed on the base 30, and the measured position is supplied to a main control system 33. The main control system 33, during scanning exposure, controls the operation of the drive motor 35 through a stage driving system 34 and drives the scanning stage 6 in X direction at a predetermined speed.

The Z levelling stage 7 is provided on the lower stage 6b of the scanning stage 6. The Z levelling stage 7 is comprised of a movable stage 7a placed on a fixed stage 7b through three expandable fulcrums 36A to 36C. The angle of inclination of the movable stage 7a in XZ plane and the angle of inclination of the movable stage 7a in ZY plane (a plane perpendicular to the plane of the drawing sheet of FIG. 2) can be adjusted by adjusting the amounts of expansion and contraction of the three fulcrums 36A to 36C. Further, by the three fulcrums 36A to 36C being expanded or contracted by the same amount in Z direction at the same time, the movable stage 7a can be displaced in Z direction. As the fulcrums 36A to 36C, use can be made of mechanisms each comprising a combination of a drive motor and a cam, systems adapted to be pushed out by screws, or piezoelectric elements. The main control system 33 sets the amounts of expansion and contraction of the fulcrums 36A to 36C through the stage driving system 34.

Turning back to FIG. 1, near the mask 4 between the upper stage 6a and the lower stage 6b, focus detecting systems 26A to 26D for the mask are disposed at equal intervals along Y direction. Also, near the plate 8 between the upper stage 6a and the lower stage 6b, focus detecting systems 28A to 28D for the plate are disposed at equal intervals along Y direction. By the focus detecting systems 26A to 26D, four measurement points 25A to 25D are set at equal intervals in Y direction on the −X side of the illuminated areas 22A to 22E on the mask 4. Also, by the focus detecting systems 28A to 28D, four measurement points 27A to 27D are set at locations on the plate 8 which are conjugate with the measurement points 25A to 25D with respect to the projection optical systems 23A to 23E.

Figure 7:
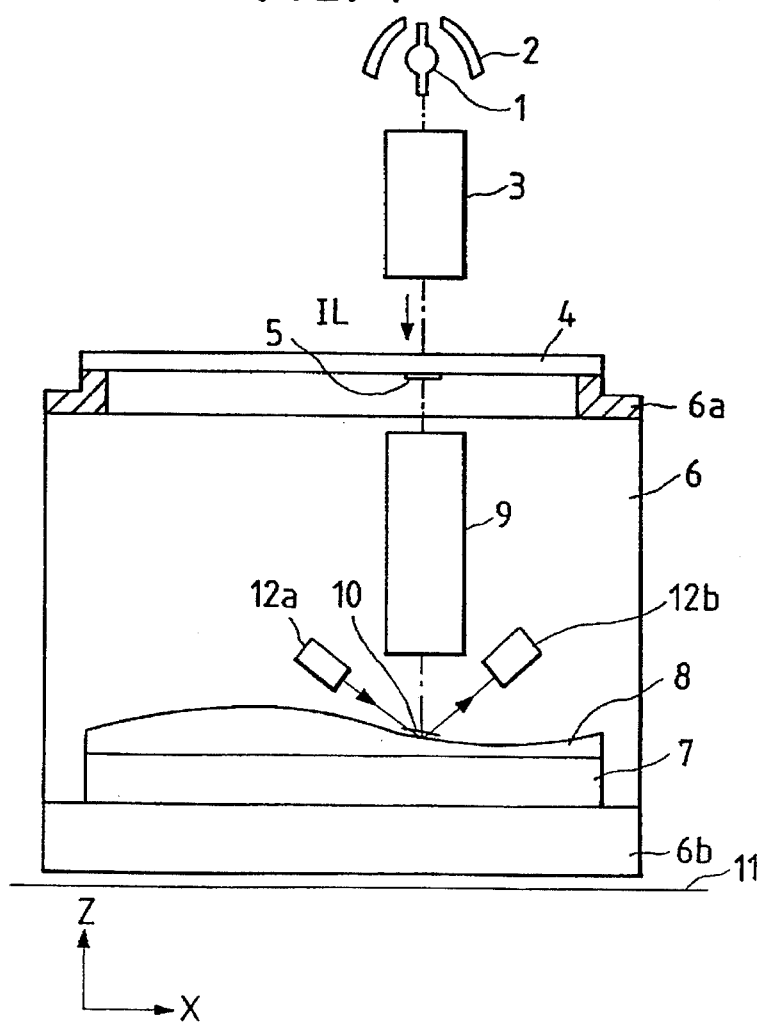
FIG. 7 schematically shows the construction of a scanning type exposure apparatus according to the prior art.

The focus detecting systems 26A to 26D detect the positions of the measurement points 25A to 25D in Z direction by an oblique incidence system. The focus detecting systems 28A to 28D detect the positions of the measurement points 27A to 27D in Z direction by an oblique incidence system. The focus detecting systems 26A to 26D and 28A to 28D are of the same construction. For example, the focus detecting system 28D is comprised of the light transmitting optical system 12a and the light receiving optical system 12b used in the example of the prior art shown in FIG. 7. A slit pattern image by detection light AL is projected from the light transmitting optical system in the focus detecting system 28D to the measurement point 27D obliquely with respect to the Z-axis, the slit pattern image is re-imaged by the light receiving optical system in the focus detecting system 28D, and a focus signal conforming to the lateral deviation of this re-imaged image from the reference position is outputted. This focus signal is a signal corresponding to the position of the measurement point 27D on the plate 8 in Z direction.

Likewise, focus signals corresponding to the position of the measurement points 27A to 27C on the plate 8 in Z direction are outputted from the other focus detecting systems 28A to 28C, and focus signals corresponding to the positions of the measurement points 25A to 25D on the mask 4 in Z direction are outputted from the four focus detecting systems 26A to 26D on the mask 4 side. In this case, as shown in FIG. 2, for example, the focus signal of the focus detecting system 26D is supplied to one input portion of an adder 37D, the focus signal of the focus detecting system 28D is supplied to the other input portion of the adder 37D, and a sum signal SD obtained by adding the two focus signals together is supplied to the main control system 33. This also holds true of the focus detecting systems 26A to 26C and the focus detecting systems 28A to 28C.

The focus signal outputted from the focus detecting system 26D, for example, is a signal corresponding to the displacement of the measurement point 25D from the design reference position thereof in +Z direction, and the focus signal outputted from the focus detecting system 28D is a signal corresponding to the displacement of the measurement point 27D from the design reference position thereof in −Z direction (a signal assuming a positive value when displacement in −Z direction occurs). Accordingly, the sum signal SD is a signal corresponding to the difference between interval H in Z direction, from the measurement point 25D to the measurement point 27D, and a reference interval $H_0$. The reference interval $H_0$ is the interval in Z direction between the pattern forming surface of the mask 4 and the exposed surface of plate 8 when the mask 4 and the plate 8 are conjugate with each other with respect to the projection optical systems 23A to 23E.

Figure 5:
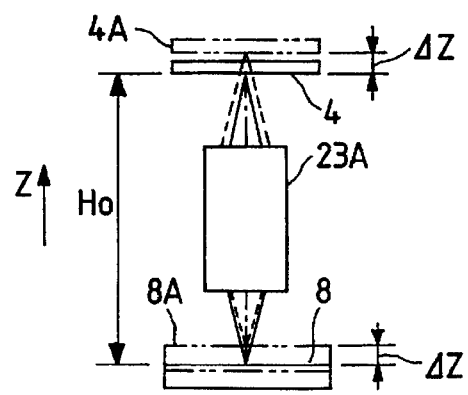
FIG. 5 illustrates the imaging characteristic of a one-to-one magnification projection optical system.

The projection optical systems 23A to 23E in the present embodiment are of one-to-one magnification. Accordingly, when the mask 4 is displaced by $\Delta Z$ in +Z direction to a position 4A (FIG. 5) from a position at which the mask 4 and the plate 8 are conjugate with each other (interval $H_0$) with respect to the projection optical systems 23A to 23E (of which only the projection optical system 23A is shown for the mask 4), the plate 8 is displaced by $\Delta Z$ in +Z direction and is set at a position 8A. Therefore the conjugate relation between the mask 4 and the plate 8 is maintained.

Turning back to FIG. 2, the sum signal SD represents the amount of deviation of the pre-read interval H between the two measurement points 25D and 27D from the reference interval $H_0$. Likewise, although not shown, the sum signals SA to SC of the focus signals of the focus detecting systems 26A to 26C and the focus signals of the corresponding focus detecting systems 28A to 28C are obtained and supplied to the main control system 33. Those sum signals SA to SC represent the amounts of deviation of the pre-read intervals H between the measurement points 25A to 25C and the corresponding measurement points 27A to 27C from the reference interval $H_0$. In the main control system 33, the supplied four sum signals SA to SD are analog/digital-converted, whereafter the amounts of deviation of the corresponding intervals in Z direction are found and the data of these amounts of deviation are successively stored into an interval memory.

In this case, as shown in FIG. 4, the interval in X direction between the exposure fields 29A, 29B in the first row and the exposure fields 29C to 29E in the second row is defined as L and the interval in X direction from a straight line passing through the center of the exposure fields 29A, 29B in the first row to a straight line passing through the measurement points 27A to 27D is defined as $L_0$. In the present embodiment, as an example, the sampling of the sum signals SA to SD is effected each time the mask and the plate are moved by L in X direction. Further, the interval $L_0$ to the measurement points 27A to 27D is set to an integer multiple of the interval L between the exposure fields 29A to 29E in the two rows. That is, by the use of 1 or greater integer N, the following expression is established:

$$L_0 = N \cdot L \tag{1}$$

Thereby, the timing for the measurement of the interval between the mask 4 and the plate 8 and the timing for the adjustment of the plate 8 by the Z levelling stage 7 can be synchronized with each other, and control becomes easy. When expression (1) is not satisfied, the timing for the adjustment by the Z levelling stage 7 can be changed.

In the present embodiment, when during scanning exposure, the pattern transfer area 24 is scanned in +X direction, the amounts of deviation indicated by the four sum signals SA to SD are successively stored into a memory in the main control system 33 correspondingly to X coordinates Xi (i=1, 2, ...) of each interval L of the scanning stage 6 of FIG. 2. Thereafter, when areas corresponding to the data of the X coordinates Xi stored in the address reach the exposure fields 29C to 29E, eight data at X coordinates Xi and a position spaced apart by L in -X direction from the X coordinates Xi are read out of the memory.

These eight data represent the amounts of deviation of the intervals between eight points on the plate 8 and the corresponding eight points on the mask 4 from the reference interval $H_0$. Therefore, the position in Z direction and the angle of inclination of the exposed surface of the plate 8 are adjusted through the Z levelling stage 7 so that those eight intervals may on average be $H_0$. When at this time, a point between sample points on the plate 8 has come into the exposure fields 29A to 29E, the control of the Z levelling stage 7 can be effected on the basis of data obtained by interpolating the measurement data at sample points before and behind that point. Also, particularly the measurement by the focus detecting systems 26A to 26D and 28A to 28D may be effected at a high speed so that the amount of positional deviation may be measured in X direction on the plate 8 at a pitch shorter than the interval L.

Description will now be made of the operation when, in the present embodiment, exposure is effected by the scanning exposure system. The mask 4 and plate 8 are scanned as a unit in X direction through the scanning stage 6. Before respective points on the plate 8 reach the exposure fields 29A to 29E, the intervals between those points and the corresponding points on the mask 4 are measured by the focus detecting systems 26A to 26D and 28A to 28D, and the sum signals SA to SD indicative of the amounts of deviation of those intervals from the reference interval $H_0$ are outputted. Also, it is to be understood that in the initial state, the surface of the movable stage 7a of the Z levelling stage 7 is parallel to the direction of running of the scanning stage 6 (this will hereinafter be called the "reference state"). The amounts of positional deviation corresponding to the sum signals SA to SD are sampled at a predetermined pitch in X direction and are successively stored into the memory in the main control system 33.

When the fore end portion of the pattern transfer area 24 of the plate 8 arrives at the exposure field 29E, the control of the angle of inclination in Z direction (levelling) and the control of the position (focusing) of the Z levelling stage 7 are started on the basis of the data of the amounts of positional deviation stored as previously described. That is, the operation of the Z levelling stage 7 is controlled so that the intervals between the eight points on the plate 8 and the corresponding eight points on the mask 4 may on average be $H_0$. In other words, the operation of the Z levelling stage 7 is controlled so that in FIG. 4, the average plane of the exposed surface of the plate 8 containing the five exposure fields 29A to 29E may be parallel to the corresponding average plane on the mask 4 and the interval may be $H_0$. Thereafter, the posture of the Z levelling stage 7 is continuously controlled correspondingly to the succeeding areas on the shot areas on the plate 8 successively arriving at the exposure field 29E. Thereby the auto levelling and auto focusing operations are executed and therefore, even if as shown in FIG. 2, the mask 4 flexes downwardly, for example, in the central portion thereof, the interval between the mask 4 and the plate 8 will be set to $H_0$ during exposure, and exposure can always by effected in the in-focus state.

When, during exposure, the surface of the Z levelling stage 7 is not parallel to the direction of running of the scanning stage 6, the result of the measurement by the focus detecting systems 28A to 28D is affected by the angle of inclination of the Z levelling stage 7. Therefore, it is necessary to correct for this effect as follows.

Figure 6:
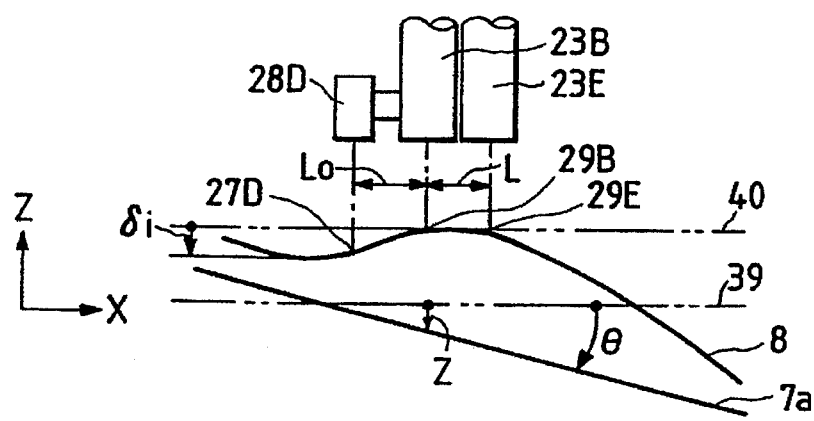
FIG. 6 illustrates a method of correcting an amount of positional deviation measured when a Z levelling stage 7 is inclined.

In order to facilitate understanding, it is assumed that the mask 4 is a completely flat plane and its position in Z direction does not change. Referring to FIG. 6, the influence of the angle of inclination of the Z levelling stage 7 in XZ plane will be considered below.

Assuming that in FIG. 6, the aforementioned expression (1) is satisfied, the control of the position in Z direction and the angle of inclination of the Z levelling stage is effected on the basis of data sampled (N+1) times before and N times before. Also, assuming that a surface 39 is the surface of the movable stage 7a of the Z levelling stage 7 in the reference state (initial state) thereof, the surface 39 in the reference state is parallel to the direction of running (X direction) of the plate 8. The surface of the movable stage 7a at present intersects the surface 39 at an angle θ and also, on the optical axis of the projection optical system 23B, the actual surface of the movable stage 7a deviates by Z in -Z direction relative to the surface 39 in the reference state.

In this state, the amount of deviation $\delta_i$ of the measurement point 27D on the plate 8 in -Z direction from the imaging plane 40 is detected by the focus detecting system 28D, and the result of the measurement of the interval between the mask 4 and the plate 8 is $(H_0 + \delta_i)$. However, assuming that the amount of deviation of the measurement point 27D in -Z direction from the imaging plane 40 when the surface of the movable stage 7a coincides with the surface 39 in the reference state is $\Delta_i$, the amount of deviation $\Delta_i$ can be expressed as follows:

$$\Delta_i = \delta_i - Z + L_0 \cdot \theta \tag{2}$$

The amount of deviation $\Delta_i$ after correction by the use of expression (2) is stored into the memory in the main control system 33 of FIG. 2. That is, design is made such that the measured value when the surface of the Z levelling stage 7 is always in the reference state is stored. In FIG. 6, only the inclination in XZ plane is taken into account, but with the inclination in ZY plane likewise taken into account, the data at the respective measurement points 27A to 27D can be converted into those when the surface of the Z levelling stage 7 is always in the reference state and be stored in the memory. Thereby, the correction of the position in Z direction and the angle of inclination of the Z levelling stage 7 can be directly effected on the basis of the data in the memory.

Also, when the exposure position on the plate 8 is disposed intermediately of the sample points of the interval measurement, for example, the data at the sample points before and behind it is interpolated to thereby obtain the data at the exposure position. The posture of the Z levelling stage 7 is controlled by the use of this interpolated data and exposure is effected, whereby exposure can be effected on the whole surface of the plate 8 in a good state.

Further, as shown in FIG. 4, in the present embodiment, four measurement points 27A to 27D are set on the plate 8 in Y direction perpendicular to the scanning direction and also, four measurement points are set on the mask 4 in Y direction. Regarding this, when the plate 8 is a glass plate for the manufacture of a liquid crystal panel, the bending of the surface of the plate 8 in Y direction is empirically expressed substantially by a tertiary function. By the position of the surface being measured at four points in Y direction, the four coefficients of the tertiary function can be determined and therefore, by using the measurement data at the four measurement points in the present embodiment, the bending of the plate 8 can be measured accurately. By increasing the number of the measurement points, even more complicated bending can be measured accurately, but if there are four measurement points, the bending of the plate for a liquid crystal panel can be measured substantially accurately at a relatively low cost.

In the above-described embodiment, the Z levelling stage 7 is provided on the plate 8 side, but alternatively, a stage for correcting the position in Z direction and the angle of inclination may be provided on the mask 4 side so that correction may be effected on the mask 4 side. As a further alternative, design may be made such that correction is effected by both of the mask 4 and the plate 8.

Also, as shown, for example, in FIG. 4, in the above-described embodiment, the measurement of the interval between the mask 4 and the plate 8 is effected by the pre-reading system and therefore, the scanning direction of the plate 8 is the direction from the measurement points 27A to 27D toward the exposure fields 29A to 29E, i.e., +X direction. In contrast, in order that the scanning direction may be either of +X direction and −X direction, a set of measurement points 41 may be set on +X direction side relative to the exposure fields 29A to 29E and a corresponding set of measurement points may also be set on the mask 4 side, and measuring means for measuring intervals between these sets of measurement points may be provided. Thereby, when the plate 8 is scanned, for example, in −X direction, correction can be effected by the use of data measured at the measurement points 41.

Further, in the above-described embodiment, use is made of the projection optical systems 23A to 23E which project erect positive images at one-to-one magnification, but the present invention can also be applied in a case where use is made of projection optical systems which project inverted images at one-to-one magnification. However, in a case where inverted images are thus projected, the scanning directions of the mask and plate become opposite and therefore, it is necessary to provide a stage for the mask and a stage for the plate discretely from each other. Also, since the scanning directions are opposite, it is necessary that to pre-read the information of the interval, the focus detecting system on the mask side and the focus detecting system on the plate side be provided in opposite directions from the projection optical systems, which are thus interposed therebetween. Further, the number of the projection optical systems may be one. The present invention can also be applied to a case where the pattern of the mask is reduced or enlarged and transferred onto the plate.

Thus, the present invention is not restricted to the above-described embodiment, but can assume various constructions in keeping with the basic principles of the invention.

What is claimed is:

1. A scanning type exposure apparatus, comprising:
   a scanning system for scanning a mask and a substrate in synchronism with each other so that a pattern of said mask can be transferred onto said substrate at one-to-one magnification through a projection optical system;
   a first detecting system for irradiating first beams of light to at least two first points on said mask spaced apart along a direction orthogonal to a scanning direction of said mask, receiving reflected light from said first points, and detecting positions of said first points along an optical axis of said projection optical system;
   a second detecting system for irradiating second beams of light to at least two second points on said substrate spaced apart along a direction orthogonal to a scanning direction of said substrate, receiving reflected light from said second points, and detecting positions of said second points along the optical axis of said projection optical system; and
   an adjusting system for adjusting posture of at least one of said mask and said substrate based on the positions detected by said first detecting system and said second detecting system.

2. A scanning type exposure apparatus according to claim 1, wherein said first beams of light are irradiated to said first points within a pattern forming area of said mask before transfer of a portion of the mask pattern in said pattern forming area, and said second beams of light are irradiated to said second points within a pattern transfer area of said substrate before transfer of said pattern portion.

3. A scanning type exposure apparatus according to claim 1, wherein said projection optical system has a first optical system and a second optical system arranged at a predetermined interval, and said first detecting system and said second detecting system effect the detection of said positions at predetermined intervals of scanning movement of said substrate and said mask.

4. A scanning type exposure apparatus according to claim 1, wherein said first points and said second points are equal in number, and said adjusting system adjusts said posture to position said first points and said second points in conjugate relation with respect to said projection optical system.

5. A scanning type exposure apparatus according to claim 1, wherein said posture includes at least one of a position along the optical axis of said projection optical system and an inclination with respect to the optical axis of said projection optical system.

6. A scanning type exposure apparatus comprising:
   a scanning system for scanning a mask and a substrate in synchronism with each other so that a pattern of said mask can be transferred onto said substrate through a projection optical system;
   a first detecting system for irradiating first beams of light to at least two first points on said mask spaced apart in a direction intersecting a scanning direction of said mask, receiving reflected light from said first points, and detecting positions of said first points along an optical axis of said projection optical system;
   a second detecting system for irradiating second beams of light to at least two second points on said substrate spaced apart in a direction intersecting a scanning direction of said substrate, receiving reflected light from said second points, and detecting positions of said second points along the optical axis of said projection optical system; and
   an adjusting system for adjusting posture of at least one of said mask and said substrate based on the positions detected by said first detecting system and said second detecting system.

7. A scanning type exposure apparatus according to claim 6, wherein said first beams of light are irradiated to said first points within a pattern forming area of said mask before transfer of a portion of said mask pattern in said pattern forming area, and said second beams of light are irradiated to said second points within a pattern transfer area of said substrate before transfer of said pattern portion.

8. A scanning type exposure apparatus according to claim 6, wherein said first points and said second points are equal in number, and said adjusting system adjusts said posture to position said first points and said second points in conjugate relation with respect to said projection optical system.

9. A scanning type exposure apparatus according to claim 6, wherein said posture includes at least one of a position along the optical axis of said projection optical system and an inclination with respect to the optical axis of said projection optical system.

10. An exposure method including the steps of:
    (a) scanning a mask and a substrate in synchronism with each other so that a pattern of said mask can be transferred onto said substrate through a projection optical system;
    (b) irradiating first beams of light to at least two points on said mask spaced apart along a direction intersecting a scanning direction of said mask, receiving reflected light from said first points, and detecting positions of said first points along an optical axis of said projection optical system;
    (c) irradiating second beams of light to at least two points on said substrate spaced apart in a direction intersecting a scanning direction of said substrate, receiving reflected light from said second points, and detecting positions of said second points along the optical axis of said projection optical system; and
    (d) adjusting posture of at least one of said mask and said substrate based on the detected positions of said first points and said second points.

11. An exposure method according to claim 10, wherein said steps (b) and (c) are performed repeatedly, for different sets of first points and different sets of second points, respectively, with the scanning of said mask and said substrate, and the detected positions for each set of points are stored.

12. An exposure method according to claim 10, wherein said posture includes at least one of a position along the optical axis of said projection optical system and an inclination with respect to the optical axis of said projection optical system.

13. A scanning type exposure apparatus for transferring a pattern of a mask onto a substrate through a projection optical system by scanning said mask and said substrate, comprising:
    a light source to irradiate exposure light;
    a first detecting system which has at least one first measurement point spaced apart, along a scanning direction of said mask, from a first predetermined area to be irradiated with the exposure light from said light source, said first detecting system detecting a position of said mask along an optical axis of said projection optical system at each said first measurement point;
    a second detecting system which has at least one second measurement point spaced apart, along a scanning direction of said substrate, from a second predetermined area to be irradiated with the exposure light through said mask and said projection optical system, said second detecting system detecting a position of said substrate along the optical axis of said projection optical system at each said second measurement point; and
    an adjusting system to adjust posture of at least one of said mask and said substrate based on detecting results of said first and second detecting systems.

14. A scanning type exposure apparatus according to claim 13, wherein said posture includes at least one of a position along the optical axis of said projection optical system and an inclination with respect to the optical axis of said projection optical system.

15. A scanning type exposure apparatus according to claim 13, wherein said first and second measurement points are in conjugate relation to each other with respect to said projection optical system.

16. A scanning type exposure apparatus according to claim 13, wherein said first detecting system has a plurality of first measurement points displaced from each other along a direction orthogonal to said scanning direction of said mask, and said second detecting system has a plurality of second measurement points displaced from each other along a direction orthogonal to said scanning direction of said substrate.

17. A scanning type exposure apparatus according to claim 13, wherein said adjusting system adjusts the posture of at least one of said mask and said substrate, based on the detected positions of said mask and said substrate, so as to maintain a predetermined interval between said mask and said substrate.

18. A scanning type exposure apparatus according to claim 13, wherein said first measurement point is disposed in advance of said first predetermined area along said scanning direction of said mask, and said second measurement point is disposed in advance of said second predetermined area along said scanning direction of said substrate.

19. A scanning type exposure apparatus according to claim 13, wherein said first predetermined area includes two areas to be irradiated with the exposure light which are disposed at a predetermined interval along said scanning direction of said mask, and are displaced from each other along a direction orthogonal to said scanning direction of said mask.

20. A scanning type exposure apparatus according to claim 19, wherein said first measurement point and one of said two areas closer to said first measurement point are disposed at an interval which is an integer multiple of said predetermined interval.

21. A scanning type exposure apparatus according to claim 13, wherein said second predetermined area includes two areas to be irradiated with the exposure light which are disposed at a predetermined interval along said scanning direction of said substrate, and are displaced from each other along a direction orthogonal to said scanning direction of said substrate.

22. A scanning type exposure apparatus according to claim 21, wherein said second measurement point and one of said two areas closer to said second measurement point are disposed at an interval which is an integer multiple of said predetermined interval.

23. A scanning type exposure apparatus according to claim 13, further comprising:
    a scanning stage to scan said mask and said substrate as a unit with respect to said exposure light.

24. A scanning type exposure apparatus according to claim 13, further comprising:

a memory to store information on relative displacement between said mask and said substrate upon scanning, and wherein said adjusting system reads out information on relative displacement from said memory, and, based on the information read out, adjusts the posture of at least one of said mask and said substrate while said mask and said substrate are being scanned and the pattern of said mask is being transferred onto said substrate.

25. A scanning exposure method for transferring a pattern of a mask onto a substrate through a projection optical system by scanning said mask and said substrate with respect to exposure light from a light source, said method comprising:

irradiating first light for position detection to at least one first measurement point spaced apart, along a scanning direction of said mask, from a first predetermined area to be irradiated with the exposure light from said light source, and detecting a position of said mask along an optical axis of said projection optical system at each said first measurement point;

irradiating second light for position detection to at least one second measurement point spaced apart, along a scanning direction of said substrate, from a second predetermined area to be irradiated with the exposure light through said mask and said projection optical system, and detecting a position of said substrate along the optical axis of said projection optical system at each said second measurement point; and adjusting posture of at least one of said mask and said substrate based on the detected positions of said mask and said substrate.

26. A scanning exposure method according to claim 25, wherein said posture includes at least one of a position along the optical axis of said projection optical system and an inclination with respect to the optical axis of said projection optical system.

27. A scanning exposure method according to claim 25, wherein said first and second measurement points are in conjugate relation to each other with respect to said projection optical system.

28. A scanning exposure method according to claim 25, wherein said first light for position detection is irradiated to a plurality of first measurement points displaced from each other along a direction orthogonal to said scanning direction of said mask, and said second light for position detection is irradiated to a plurality of second measurement points displaced from each other along a direction orthogonal to said scanning direction of said substrate.

29. A scanning exposure method according to claim 25, wherein the posture of at least one of said mask and said substrate is adjusted, based on the detected positions of said mask and said substrate, so as to maintain a predetermined interval between said mask and said substrate.

30. A scanning exposure method according to claim 25, wherein the posture of at least one of said mask and said substrate is adjusted, based on the detected positions of said mask and said substrate, so as to maintain a conjugate relation between said mask and said substrate with respect to said projection optical system.

31. A scanning exposure method according to claim 25, wherein said first measurement point is disposed in advance of said first predetermined area in said scanning direction of said mask, and said second measurement point is disposed in advance of said second predetermined area in said scanning direction of said substrate.

32. A scanning exposure method according to claim 25, wherein said first predetermined area includes two areas to be irradiated with the exposure light which are disposed at a predetermined interval in said scanning direction of said mask, and which are displaced from each other in a direction orthogonal to said scanning direction of said mask.

33. A scanning exposure method according to claim 32, wherein said first measurement point and one of said two areas closer to said first measurement point are disposed at an interval which is an integer multiple of said predetermined interval.

34. A scanning exposure method according to claim 25, wherein said second predetermined area includes two areas to be irradiated with the exposure light which are disposed at a predetermined interval along said scanning direction of said substrate, and are displaced from each other along a direction orthogonal to said scanning direction of said substrate.

35. A scanning exposure method according to claim 34, wherein said second measurement point and one of said two areas closer to said first measurement point are disposed at an interval which is an integer multiple of said predetermined interval.

* * * * *